United States Patent [19]

Hanawa et al.

[11] Patent Number: 4,894,799
[45] Date of Patent: Jan. 16, 1990

[54] CONTENT-ADDRESSABLE MEMORY

[75] Inventors: Makoto Hanawa, Kokubunji; Takuichiro Nakazawa, Kodaira, both of Japan

[73] Assignee: Hitachi, Ltd., Tokyo, Japan

[21] Appl. No.: 193,942

[22] Filed: May 12, 1988

[30] Foreign Application Priority Data

May 13, 1987 [JP] Japan ................................ 62-114599

[51] Int. Cl.$^4$ .............................................. G11C 15/00
[52] U.S. Cl. ........................................ 365/49; 365/154
[58] Field of Search .................. 365/49, 154, 189, 190, 365/202, 156

[56] References Cited

U.S. PATENT DOCUMENTS 4,523,301  6/1985  Kadota et al. ........................ 365/49
4,646,271  2/1987  Uchiyama et al. .................... 365/49

FOREIGN PATENT DOCUMENTS 0233453  8/1987  European Pat. Off. ............... 365/49

Primary Examiner—Joseph A. Popek
Attorney, Agent, or Firm—Fay, Sharpe, Beall, Fagan, Minnich & McKee

[57] ABSTRACT

A content-addressable memory which has a storage bit cell (121, 122), signal supplying circuits (380, 390, 400) and comparison circuits (125, 126, 127, 128). The storage bit cell (121, 122) holds a first data (D) and a second data ($\overline{D}$) of opposite phases. The signal supplying circuits (380, 390, 400) supply a first signal (a1) and a second signal ($\overline{a1}$), respectively, to a first data line (180) and a second data line (190) of the storage bit cell (121, 122) in response to an input signal (A1) and a control signal (510). The first and second signals (a1, $\overline{a1}$) are in opposite phases. The comparison circuits (125, 126, 127, 128) detect the relation between the first (D) stored in the storage bit cell (121, 122) and the first signal (a1) on the first data line (180) supplied from the signal supplying circuits (380, 390, 400) and the relation between the second data ($\overline{D}$) stored in the storage bit cell (121, 122) and the second signal ($\overline{a1}$) on the second data line (190) supplied from the signal supplying circuits (380, 390, 400). Wherein as part of the signal supplying circuit (380, 390, 400) circuit (400) dissolves the opposite phase relation between the first signal (a1) on the first data line (180) and the second signal ($\overline{a1}$) on the second data line (190) in response to a control signal (510) and the input signal (A1). However, this circuit (400) does not dissolve the opposite phase relation when the input signal (A1) is "1" level and the control signal (510) is "1" level.

7 Claims, 3 Drawing Sheets

CONTENT-ADDRESSABLE MEMORY

BACKGROUND OF THE INVENTION

1. Field of the Invention

The present invention is related to a content-addressable memory and more particularly to a content-addressable memory such as an address array in the cache memory realized in VLSI and a translation lookaside buffer for address translation.

2. Description of the Prior Art

As an example of conventional content-addressable memory that facilitates testing, a device introduced in a publication of the 16th Fault-Tolerant computer symposium (1986) of IEEE, page 34 to 39, may be cited.

Such a conventional content-addressable memory consists of a storage bit cells; a comparison means (made up of an Exclusive OR circuit) which has the output of the storage bit cell applied to one of its inputs (first input) and a search input to the other input (second input); and an OR circuit which has the output of the comparison means applied to one of its inputs (first input) and a mask signal of a mask register applied to the other input (second input).

Detecting a fault in the content-addressable memory involves entering a prescribed data into the storage bit cell of the content-addressable memory, supplying the same data as the prescribed data to the second input of the comparison means as a search input, and applying no mask to the output of the comparison means. By checking the non-masked output of the comparison means, it is possible to decide whether there is any fault with the content-addressable memory.

When the content-addressable memory has a wide bit width, say, 32 bits, the data used for memory fault detection becomes large. To avoid this, the mask operation using the mask register and the OR circuit is effective in checking the content-addressable memory. With masking, a partial and detailed fault detection can be made on the content-addressable memory by using only a small amount of fault detecting data.

As mentioned above, with the conventional content-addressable memory, it is possible to eliminate the associative search at any bit location by appropriately setting the mask register. It is also possible to read the content of the result of search (bit register).

SUMMARY OF THE INVENTION

The examination by this inventors, however, has found that the conventional content-addressable memory of known structure has the following drawbacks.

That is, the OR circuit in the content-addressable memory is needed only for fault detection and not necessary for normal operation of the memory. Thus, the OR circuit increases the number of circuit elements as well as the cell size, which in turn leads to an increased size of hardware of the content-addressable memory as a whole.

Furthermore, the OR circuit, since it is connected in series with the output of the comparison means, causes a delay in the data reading from the content-addressable memory.

Based on the result of the above examination, this invention is accomplished to permit high-speed reading of the contents of the content-addressable memory cells and facilitate the fault check on the content-addressable memory by minimizing an increase in added hardware.

The outline of this invention disclosed in the following description may be summarized as follows.

The content-addressable memory according to this invention comprises: (1) storage bit cells 121, 122 holding first data (D) and second data ($\overline{D}$), the two data in opposite phases; (2) signal supplying means 380, 390, 400 for supplying first signal al and second signal $\overline{al}$, the two signals in opposite phases, to first data line 180 and second data line 190 respectively in response to an input signal Al; and (3) comparison means 125, 126, 127, 128 for detecting the relation between the first data D and the first signal al and between the second data $\overline{D}$ and the second signal $\overline{al}$; wherein the signal supply means 380, 390, 400 have a means 400 to dissolve the opposite-phase relation between the first and second signals al, $\overline{al}$ in response to a control signal 510.

When the opposite-phase relation is dissolved, the first and second signals al, $\overline{al}$ are virtually equal in level. Therefore, comparison by the comparison means 125, 126, 127, 128 becomes impossible, allowing the storage bit cell 121, 122 to be masked.

Since the signal supply means 380, 390, 400 that perform masking are originally provided to supply the first and second signals al, $\overline{al}$ in opposite phases to the first and second data lines 180, 190 in response to the input signal Al, there will be no delay in the data reading from the storage bit cell 121, 122. Furthermore, the number of circuit elements that are added for masking operation can be limited to a very small value.

DESCRIPTION OF THE PREFERRED EMBODIMENT

Figure 1:
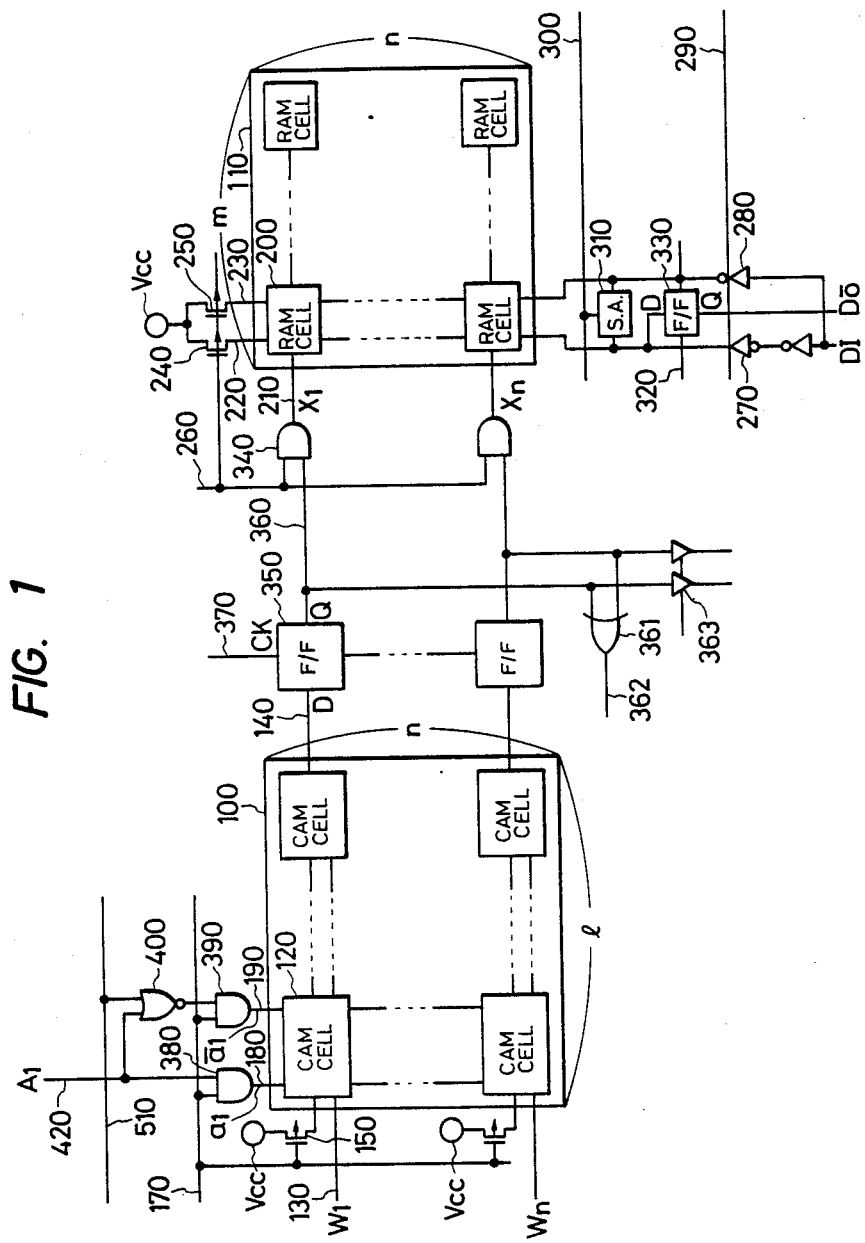
FIG. 1 is a circuit configuration of one embodiment of invention.

Now, one embodiment of this invention will be described in detail by referring to the accompanying drawings. FIG. 1 shows the overall configuration of the content-addressable memory.

The device of this invention has two memory arrays: a content-addressable memory (CAM) array 100 and a random access memory (RAM) array 110. The CAM array 100 is arranged in l bits $\times$ n words with each bit made up of one CAM cell 120. Each word of the CAM array 100 consists of l CAM cells 120. The l CAM cells 120 in each word are connected to a CAM word selection line 130 (Wl to Wn) and to a word coincidence line 140. The word coincidence line 140 is pulled up at one end to a power source Vcc through a P-channel MOS transistor 150. The P-channel MOS transistor 150, when the CAM array is not in the associative search operation, is brought into conduction by the CAM access command line 170 to precharge the word coincidence line 140. Each cell 120 of the CAM array 100 is connected to a first data line 180 and a second data line 190.

AND circuits 380, 390 and a NOR circuit 400 operate as a signal supply means to supply a first signal al and a second signal $\overline{al}$, the two in opposite phases, to the first data line 180 and the second data line 190 respectively in response to an input signal Al.

Figure 2:
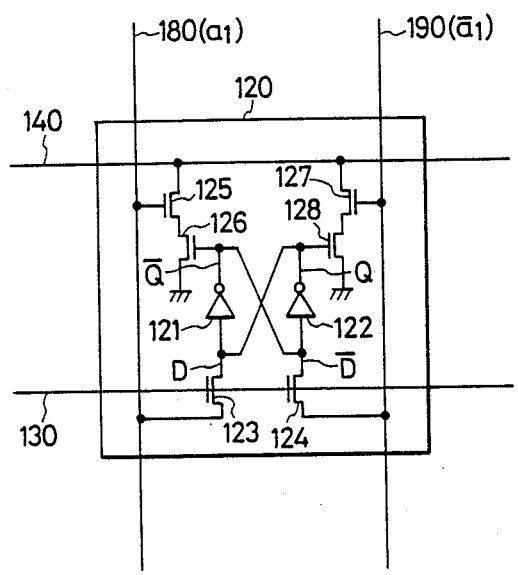
FIG. 2 is a configuration of CAM (content-addressable memory) cell.

FIG. 2 shows the internal configuration of the CAM cell 120. The CAM cell 120 consists of inverters 121, 122 and N-channel MOS transistors (N-channel MOSFET) 123 to 128.

The inverters 121, 122 form a latch to hold data. The cross-coupled inverters 121, 122 operate as storage bit cell to hold the first data D and the second data $\overline{D}$, these data in opposite phases.

The N-channel MOS transistors (N-channel MOSFET) 125 to 127 serve as a comparison means to detect relationship between the first data D and the first signal al and between the second data $\overline{D}$ and the second signal $\overline{al}$.

The N-channel MOSFET's 123, 124 are brought into conduction by the CAM word selection line 130 to set values on the data line 180, 190 into the latch of the inverters 121, 122.

When in the storage bit cell (121, 122) the first data D is at low level and the second data $\overline{D}$ is at high level (i.e., Q is low and $\overline{Q}$ is high), the content of the latch is defined as "0". When their levels are reverse to the above, it is defined as "1".

When the associative search input data Al is high (i.e., al is high and $\overline{al}$ is low), the content of the associative search input data is defined as "1". When it is low, its content is defined as "0".

Thus, when the content of latch is "0" and the associative search input data Al is "1", the N-channel MOSFET's 125, 126 discharge the word coincidence line 140. The N-channel MOSFET's 127, 128 discharge the word coincidence line 140 when the content of the latch is "1" and the associative search input data is "0".

When the content of the latch and the content of the associative search input data agree, the word coincidence line 140 is not discharged and maintains the level precharged through the P-channel MOS transistor 150.

On the other hand, the RAM array 110 is arranged in m bits×n words, as shown in FIG. 1. Each bit is formed of one RAM cell 200. Each word of the RAM array 110 consists of m RAM cells 200. The n RAM cells 200 in each word are connected to a RAM word selection line 210 (X1 to Xn). The cells 200 in the RAM array 110 are each connected to two data lines 220, 230.

Figure 3:
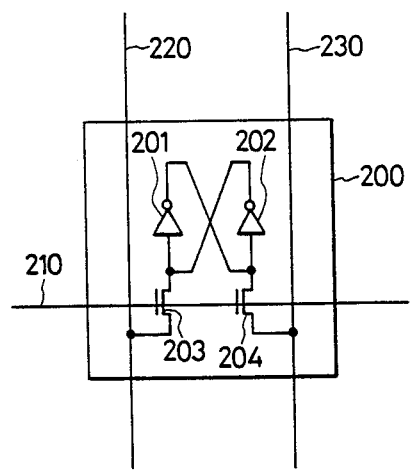
FIG. 3 is a configuration of RAM cell.

FIG. 3 shows the internal configuration of the RAM cell 200. The RAM cell 200 consists of inverters 201, 202 and N-channel MOSFET's 203, 204.

The inverters 201, 202 form a latch to hold data. The N-channel MOSFET's 203, 204 are brought into conduction by the RAM word selection line 210 to write the values of data lines 220, 230 into the latch or read the content of the latch out onto the data lines 220, 230. The data lines 220, 230, as shown in FIG. 1, are pulled up to a power source Vcc through P-channel MOS transistors 240, 250. The P-channel MOS transistors 240, 250 are brought into conduction by a RAM access command line 260 to precharge the data lines 220, 230 when the RAM array is not accessed.

The data lines 220, 230 represent a positive polarity signal and a negative polarity signal for the read/write data. In writing data into the RAM array 110, a RAM word selection signal 210 (Xi) is selected, the RAM access command signal 260 is asserted and at the same time the RAM write command signal 290 is also asserted to output both the positive and negative polarity signals of the input data DI to the data lines 220, 230 by data write drivers 270, 280. This permits the input data DI to be written into an i-th word in the RAM array.

In reading data from the RAM array 110, a RAM word selection line 210 (Xi) is selected, the RAM access command signal 260 is asserted and at the same time a sense enable command signal 300 is also asserted to amplify a small signal read from the RAM cell onto the data lines 220, 230 by a differential type sense amplifier 310. The amplified signal is then taken into the read data latch 330 by a data latch command signal 320. With the above operation, the data DO can be read from an i-th word in the RAM array.

When the RAM access command signal 260 is being asserted, the RAM word selection line 210 (Xi) is determined, through the action of an AND gate 340, by the output 360 from the CAM associative search result latch 350.

The latch 350 according to the associative search result latch command signal 370 latches the value of the word coincidence line 140 of the CAM array 100.

The CAM associative search result latch output 360 determines the RAM word selection line Xi 210. At the same time, the latch outputs 360 of all words are ORed by the OR gate 361 to generate a HIT signal 362 which indicates whether there is any word that agrees with a specified data as a result of associative search. It is also possible to read out the associative search result 360 of each word through an output buffer 363.

With the mask signal 510 negated, the CAM data lines 180, 190 output the positive and negative polarity signals of the input address Ai 420 when the CAM access command signal 170 is applied through the AND gates 380, 390 and the NOR gate 400.

[Writing Data into the CAM Array]

When writing data into the CAM array 100, the mask signal 510 is negated and the CAM access command signal 170 is asserted to output the positive and negative polarity signals al, $\overline{al}$ of the input address 420 onto the data lines 180, 190. At the same time, the CAM word selection line Wi 130 is asserted to write the content of the input address 420 into the i-th word of the CAM array 100.

[CAM Array Associative Search Operation without Using Masking]

In performing the associative search on the CAM array 100 by the input address 420, the mask signal 510 is negated and the CAM access command signal 170 is asserted to output the positive and negative polarity signals al, $\overline{al}$ of the input address 420 onto the data lines 180, 190. Then, when the content of the CAM cell is different from the value of the input address, the word coincidence line 140 of the word that was precharged is discharged. The word coincidence line 140 is kept precharged only when the entire data in the word agree with the value of the input address. The value of the word coincidence line 140 can then be held in the associative search result latch 350 by the latch command signal 370.

[CAM Array Partial Associative Search Operation Using Masking]

For a partial associative search on the CAM array 100, a search is made in the direction perpendicular to the direction of word. When the i-th line in the CAM array 100 is to be searched, the mask command signal 510 is asserted and data of the input address Al which has its i-th bit at "1" with all other bits "0" is entered. Then, the CAM access command signal 170 is asserted, which causes the positive and negative polarity signals al, $\overline{al}$ of the input address Ai at the i-th line to be output on the data lines 180, 190 and the polarity signals al, $\overline{al}$ on other lines to be both "0". This means the associative search is done for only the i-th line and the word coincidence lines 140 are not discharged by other lines whatever the contents of the CAM cells 120 on these lines. For only the word whose i-th CAM cell content is "0", the word coincidence line is discharged. As a result, the content of the i-th CAM cell, which is "0[, is read onto the word coincidence line 140. The content read onto the word coincidence line 140 is latched by the associative search result latch 350 and can then be read out through an output buffer 363.

The above-mentioned partial associative search operation on the CAM array by using masking is effective for partial and detailed fault detection on two or more CAM cells 120 in the CAM array 100.

Figure 5:
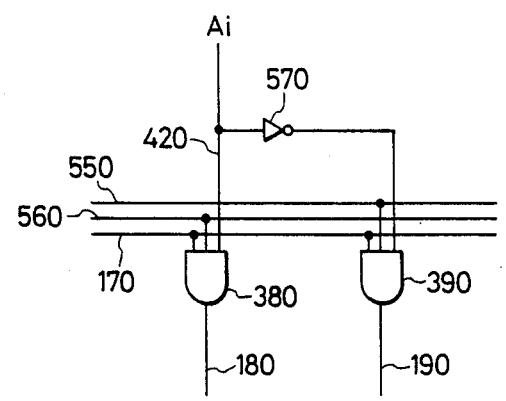
FIG. 5 is a configuration of another mask circuit.

The mask circuit of FIG. 1 can be changed to the circuit shown in FIG. 5. In the circuit of FIG. 5, the AND gates 380, 390 have three inputs. The AND gate 380 has a positive polarity validity command signal 560 in addition to the CAM access command signal 170 and the input address 420. The AND gate 390, similarly, has a negative polarity validity command signal 550 in addition to the CAM access command signal 170 and the inverted input address 420 (obtained through an inverter 570).

When making a partial associative search on the CAM array by using this mask circuit, the negative polarity validity command signal 550 is negated and the positive polarity validity command signal 560 is asserted to mask the negative polarity data line 190 for all bits. And only the i-th bit of the input address is set to "1" with the remaining bits at "0". This permits the associative search to be made on only the i-th line of the CAM array.

Further, according to the embodiment of FIG. 5, it is possible to make an associative search operation for the inverted content of the i-th cell of the CAM array. The process consists of asserting the negative polarity validity command signal 550, negating the positive polarity validity command signal 560 to mask the positive polarity data lines 180 for all bits, and setting the i-th bit of the input address to "0" with all other bits at "1".

In the embodiment of FIG. 1, the associative search result (the result of reading the CAM array) is read out for all words parallelly. To reduce wiring for reading the result, it is possible to multiplex the result of reading each word by a selector.

Figure 4:
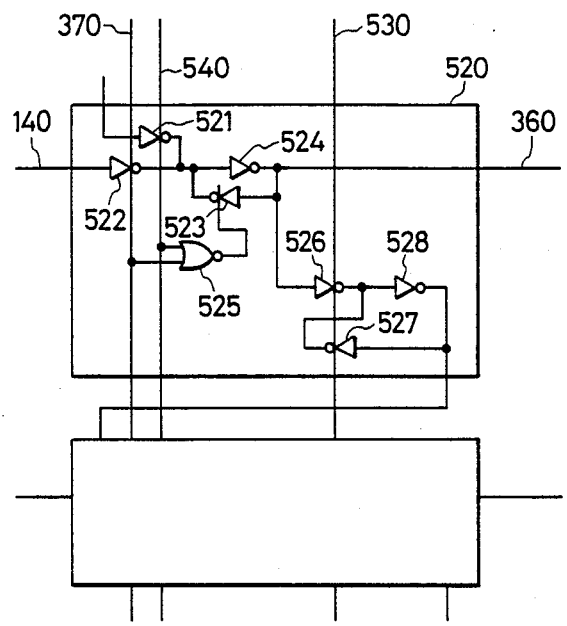
FIG. 4 is a configuration of an association result latch circuit in another embodiment.

Another example is shown in FIG. 4, in which the associative search result latch 350 of FIG. 1 is replaced with a latch 520 which has a serial scan circuit or its equivalent. The latch 520 is a shift register which consists of a first latch and a second latch, the first latch being made up of clocked inverters 521, 522, 523, an inverter 524 and a NOR gate 525, the second latch being made up of clocked inverters 526, 527 and an inverter 528. In normal operation, the value on the word coincidence line 140 is set in the first latch by the latch command signal 370 and output on the output line 360. In the serial scan operation, the value in the first latch is transferred to the second latch by a signal 530. Then the word coincidence line value of the immediately preceding word contained in the second latch is transferred to the first latch. With this operation the content in the first latch can be shifted serially and read out. The embodiment of FIG. 4 has the advantage that since the results of reading the CAM array are output serially, the amount of output wiring is reduced.

As explained above, since this invention permits reading of the CAM array without adding a read sense amplifier, read data latch, data line precharge and data line tristate circuits, the amount of circuits can be reduced.

We claim:

1. A content-addressable memory comprising;
   a storage bit cell for holding a first data and a second data, these first and second datas being in opposite phases;
   signal supplying means for supplying a first signal and a second signal, respectively, to a first data line and a second data line of the storage bit cell in response to an input signal, the first and second signals being in opposite phases;
   comparison means for detecting a first relation between the first data stored in the storage bit cell and the first signal on the first data line supplied from the signal supplying means and a second relation between the second data stored in the storage bit cell and the second signal on the second data line supplied from the signal supplying means,
   controlling means for controlling a potential of a word coincidence line based on the result of detecting by the comparison; and,
   means for reading out information of the word coincidence line, wherein the signal supplying means has a means for dissolving the opposite phase relation between the first signal on the first data line and the second signal on the second data line in response to a control signal and the input signal.

2. A content-addressable memory according to claim 1, wherein the storage bit cell is formed of cross-coupled first and second inverters.

3. A content-addressable memory according to claim 2, wherein the comparison means comprising:
   a first transistor with its gate connected to the output of the first inverter;
   a second transistor with its gate connected to the output of the second inverter;
   a third transistor with its gate supplied with the first signal, the source-drain path of the third transistor being connected in series with the source-drain path of the first transistor; and
   a fourth transistor with its gate supplied with the second signal, the source-drain path of the fourth transistor being connected in series with the source-drain path of the second transistor.

4. A content-addressable memory according to claim 3, wherein the third and fourth translators are connected to the word coincidence line.

5. A content-addressable memory according to claim 4, further comprising:
   precharging means connected between the word coincidence line and a power source.

6. A content-addressable memory according to claim 5, further comprising:
   a RAM array connected to the word coincidence line.

7. A content-addressable memory according to claim 6, further comprising:
   latch means connected between the word coincidence line and the RAM array.

* * * * *